United States Patent [19]

Findlay

[11] Patent Number: 4,692,395

[45] Date of Patent: Sep. 8, 1987

[54] TRANSFER ELEMENT AND PROCESS FOR RADIATION DEFINED IMAGES

[75] Inventor: Hugh T. Findlay, Lexington, Ky.

[73] Assignee: International Business Machines Corporation, Armonk, N.Y.

[21] Appl. No.: 823,708

[22] Filed: Jan. 29, 1986

[51] Int. Cl.⁴ .......................... G03C 1/68; G03F 7/26
[52] U.S. Cl. ..................................... 430/254; 430/273
[58] Field of Search ............................... 430/254, 273

[56] References Cited

U.S. PATENT DOCUMENTS

| | | | |
|---|---|---|---|
| 3,060,023 | 10/1962 | Burg et al. | 430/254 |
| 3,203,805 | 8/1965 | Burg | 430/254 |
| 3,264,103 | 8/1966 | Cohen | 430/254 |
| 3,387,974 | 6/1968 | Dulmage et al. | 430/254 |
| 3,622,320 | 11/1971 | Allen | 430/254 |
| 4,080,897 | 3/1978 | Gundlach | 101/467 |

Primary Examiner—Richard L. Schilling
Attorney, Agent, or Firm—John A. Brady

[57] ABSTRACT

A transfer medium has a transparent supporting substrate (1), an intermediate layer of photocurable material, (3), and outer layer of densely packed pigment bonded with photocurable material (5). Ultraviolet radiation in of the negative of the desired image is directed through the supporting substrate (1) to cure the intermediate layer. This is then pressed with heat on a paper, to which uncured areas transfer as an image by melting. The pigment and support layers block air and light from the intermediate layer which would deteriorate the intermediate layer. The image obtained is dense and permanent.

8 Claims, 3 Drawing Figures

TRANSFER ELEMENT AND PROCESS FOR RADIATION DEFINED IMAGES

DESCRIPTION

1. Technical Field

This invention relates to printing from a transfer medium in which the image transferred is defined by an optical image or other radiation image applied to the transfer medium. After the image is defined the transfer medium is brought into contact with paper or other ink-receiving medium to which ink is transferred in the defined pattern from the transfer medium.

2. Background Art

U.S. Pat. No. 4,080,897 to Gundlach shows an imaging system in which an adhesive layer is modified by radiation applied through a supporting substrate and ink is transferred to the adhesive in the pattern of the radiation. This first sheet carrying the patterned ink is then brought in contact with a receiving sheet between pressure rollers, thereby transferring the ink to the receiving sheet. Such an imaging system does not employ a curable material protected chemically by the substrate and an opposite layer, as is employed in accordance with this invention.

Systems are known which employ microcapsules in a transfer medium. Radiation is applied to the microcapsules to harden them by chemical reaction and, thereby, selectively prevent crushing of the microcapsules in the form of the image of the radiation. Pressure is then applied to the transfer medium to force material from those microcapsules that still can be crushed which then react to form marks or colors. This invention does not employ microcapsules. Such microcapsule systems would make their color from dyes, for example leuco dyes, which are not dense and degrade with time. This invention is readily suited to apply pigments as the coloring matter.

3. Disclosure of the Invention

A transparent supporting substrate (preferably MYLAR polyester) is coated with a photocurable material (preferably Celanese Corp. acrylic oligomer RDX-65775 and the surface of the layer of photocurable material is coated with pigment (preferably carbon black). Ultraviolet radiation in the pattern of the desired image is directed through the supporting substrate to selectably cure the intermediate layer. This is then pressed with heat on a paper, to which uncured areas transfer as an image by melting. The cured areas do not melt at the transfer temperature.

The two outer layers protect the photocurable layer from air which would cause chemical degradation. The photocurable layer may be a single material or a simple mixture and, therefore, is potentially trouble-free and inexpensive. Since the coloring matter is a pigment, archival permanence is achieved and light fastness is good.

BRIEF DESCRIPTION OF THE DRAWING

The details of this invention will be described with reference to the accompanying drawings, in which.

BEST MODE FOR CARRYING OUT THE INVENTION

Figure 1:
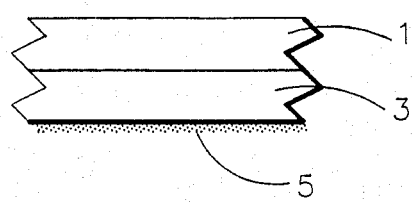
FIG. 1 is an enlarged, fragmentary side view illustrative of the transfer medium of this invention.

Referring to FIG. 1, the transfer medium of this invention has three layers, a transparent support layer 1, and intermediate, photocurable layer 3 and a pigmented, outer layer 5. Support layer 1 in the specific embodiment is an 0.25 mil (approximately 6.35 microns) thick sheet of MYLAR polyethylene terephthalate available commercially as a self-supporting film. Photocurable layer 3 is also 0.25 mil (approximately 6.35 microns) of Celanese Corp. RDX-65775 acrylic oligomer. This material is normally slid and further cures when ultraviolet radiation is applied to it to raise its melting point significantly. Pigmented layer 5 is a 0.10 mil (approximately 2.54 microns) layer of Regal 400 carbon black with sufficient of the Celanese Corp. RDX-65775 acrylic oligomer to thoroughly cover the carbon black. The carbon black is thick enough to shield the intermediate layer 3 from atmospheric air and light, thereby, protecting the oligomer of layers from deterioration which might be caused by air or light reaching the oligomer for an extended period of time. Light is often not a factor since the material may be rolled and stored in a protective container.

This transfer medium typically is a sheet the size of office correspondence paper or advertising copy. For special purpose applications such as where printing is to be one line at a time, this transfer medium may be a ribbon similar in overall configuration to a standard film printer and wide enough for one character.

The intermediate layer 3 is made from a solution of 60% by weight of the acrylic oligomer and 40% by weight isoprophyl alcohol coated onto the polyester sheet by standard reverse roll coater, followed immediately by drying at 70 degrees C or less in an over with gentle air circulation. The pigmented coating 5 is then formed by applying a fluid slurry of the carbon black and the acrylic oligomer dispersed in isopropyl alcohol, with the ratio by weight of carbon black and oligomer to alcohol also being 60% solids to 40% alcohol. The carbon black comprises between 90% and 50% by weight of the total solid of the slurry. It is likewise coated be reverse roll coater and dried at 70 degrees C. or less in an oven with gentle air circulation. The Celanese Corp. RDX-65775 acrylic oligomer is sold as a general-purpose radiation hardenable material. It comprises acrylic monomers and polymers and, assuming it is typical, also contains an ultraviolet initiator. Drying at 70 degrees C. or less is a precatuion to avoid curing of the material caused by heat activation. The uncured material is a consistent solid which melts at low temperatures, specifically, it becomes tacky at approximately 54 degrees C. and becomes increasingly liquid at higher temperatures. The cured material melts at substantially higher temperatures, specificially, beginning to soften at more than 85 degrees C.

Figure 2:
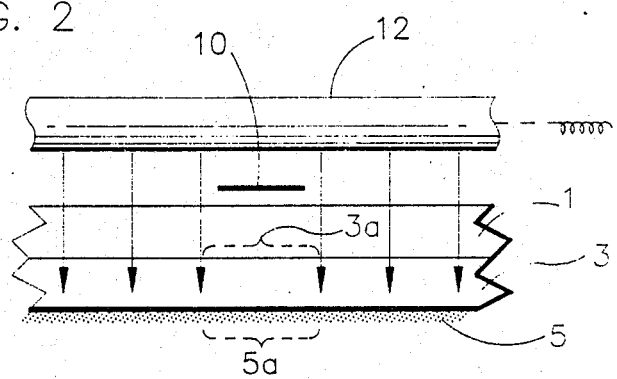
FIG. 2 is illustrative of imaging the transfer medium.

Referring to FIG. 2, a typical imaging operation is illustrated. A mask 10, in the form of the positive of the desired final image is positioned between the support layer 1 and a lamp 12 or other source of ultraviolet radiation. Mask 10 is coextensive with the area of transfer medium which will receive radiation from source 12. (Alternately, mask 10 might be eliminated by applying light from a point light source, such as a laser, which traces the negative of the desired image. Light from source 12 passes through support layer 1 because it is transparent and finds the acrylic oligomer of layers 3 and 5. The acrylic oligomer responds immediately to this light energy by further linking or polymerizing the molecules of layer 3, thereby, raising the melting point of areas treated by the light. This is completed in less than 2 seconds. This is a permanent change, and the transfer medium, once modified by the optical image, may be stored indefinitely before the image is transferred to paper or the like.

Figure 3:
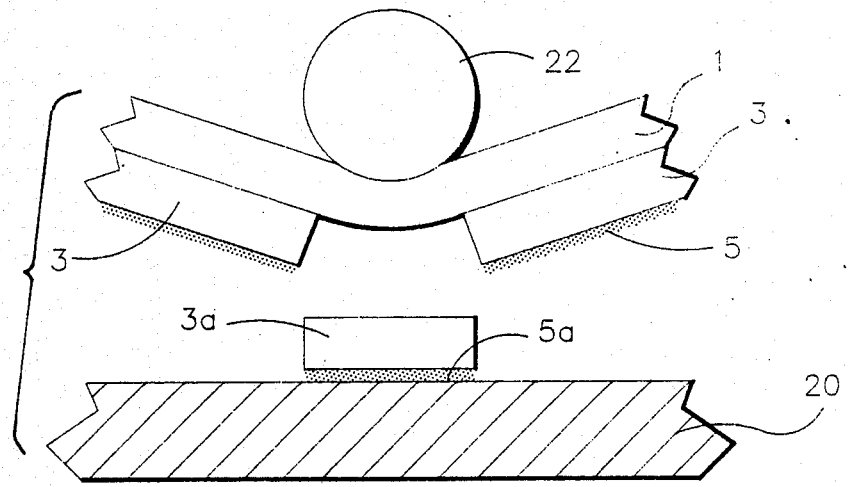
FIG. 3 shows the transfer of the final image to paper.

Transfer of the image to paper 20 is illustrated in FIG. 3. The paper is firmly supported from one side and the transfer medium of this invention after having been treated by the radiation image is laminated to it. A hot roller 22 is then applied to the support layer 1 of the transfer medium. Area made up of 3a and 5a of the transfer medium was not under the radiation, while surrounding areas were. The untreated area is melted or softened at the temperature caused by roller 22 and transfers to paper 20 while the surrounding area stays laminated to support layer 1. FIG. 3 shows the transfer medium after separation from paper 20, as is done after the head treatment by roller 22, to illustrate the difference between parts of the transfer medium which are not transferred and parts 3a and 5a which are transferred.

As the carbon black is a dense pigment, a black, dense image on paper is created. The transfer medium of this invention can be rolled in a spool or stored as contacting sheets until subject to light and heat. The light treated transfer medium can be similarly stored until treated by heat. The coloring matter being a pigment, as distinguished from dyes, good archival permanence and light fastness is assured. It will be clear that alternative chemicals and materials having the characteristics as herein described may be used to practice this invention. Coverage commensurate with the true scope of this invention is requested, as provided by law, with particular reference to the following claims.

What is claimed is:

1. A transfer material responsive to radiation comprising a support layer transparent to said radiation; and outer layer comprising pigment of thickness preventing atmospheric air from freely passing therethrough, said pigment being at least 50% by weight of the weight of said outer layer; and an intermediate layer between said support layer and said outer pigment layer; said intermediate layer being curable under radiation transmitted through said support layer and being meltable at one temperature when not so cured and being meltable at a higher temperature when so cured.

2. The transfer medium as in claim 1 in which said support layer is a polyester film and said pigment layer comprises densely packed pigment bonded with the same material as the curable material of said intermediate layer.

3. The transfer medium as in claim 2 in which said support layer is polyethylene terephthalate, said curable material is an acrylic oligomer, and the thickness of said outer layer is less than one-half the thickness of either said support layer or said intermediate layer.

4. A transfer medium responsive to radiation comprising a support layer transparent to said radiation; an outer layer of pigment of thickness preventing atmospheric air from freely passing therethrough bonded with a material curable under radiation transmitted throught said support layer; and an intermediate layer between said support layer and said pigment layer; said intermediate layer being curable under radiation transmitted through said support layer and being meltable at one temperature when not so cured and being meltable at a higher temperature when so cured.

5. The transfer medium as in claim 4 in which said support layer is a polyester film and said pigment layer comprises densely packed pigment bonded with the same material as the curable material of said intermediate layer.

6. The transfer medium as in claim 5 in which said support layer is polyethylene terephthalate, said curable material is an acrylic oligomer, and the thickness of said outer layer is less than one-half the thickness of either said support layer or said intermediate layer.

7. The method of applying a colored image to a porous substrate comprising applying a pattern or radiation in the form of said image through the substrate of a transfer medium having a substrate transparent to said radiation, an intermediate layer which cures in response to said radiation to change in melting point and an outer layer comprising a pigment, said pigment being at least 50% by weight of the weight of said outer layer; contacting said outer layer with said porous substrate, and heating during said contacting to flow by melting portion of said intermediate layer having a lower melting point than other portions of said intermediate layer as a result of said curing in response to said radiation.

8. The method as in claim 7 in which said intermediate layer is a material which reacts to further link molecules, resulting in a higher melting point for the reacted material.

* * * * *

UNITED STATES PATENT AND TRADEMARK OFFICE
CERTIFICATE OF CORRECTION

PATENT NO. : 4,692,395

DATED : September 8, 1987

INVENTOR(S) : Hugh T. Findlay

It is certified that error appears in the above-identified patent and that said Letters Patent is hereby corrected as shown below:

Col. 1, line 41   Begin new paragraph with "A transparent..."
Col. 1, line 44   After "RDX-65775" insert -- ) --.
Col. 2, line 13   Delete "slid" and insert -- solid --.
Col. 2, line 36   Delete "over" and insert -- oven --.
Col. 2, line 50   Delete "precatuion" and insert -- precaution --.
Col. 2, line 66   After "image" insert -- ) --.
Col. 2, line 66   Begin New paragraph with "Light from..."
Col. 3, line 21   Delete "head and insert -- heat --.
Col. 3, line 40   Delete "and" and insert -- an --.
Col. 4, line 16   Delete "throught" and insert -- through --.
Col. 4, line 33   Delete "or" and insert -- of --.

Signed and Sealed this

Eleventh Day of October, 1988

Attest:

DONALD J. QUIGG

*Attesting Officer*              *Commissioner of Patents and Trademarks*